US008010926B2

(12) United States Patent  
Alpert et al.

(10) Patent No.: US 8,010,926 B2
(45) Date of Patent: Aug. 30, 2011

(54) CLOCK POWER MINIMIZATION WITH REGULAR PHYSICAL PLACEMENT OF CLOCK REPEATER COMPONENTS

(75) Inventors: Charles J. Alpert, Cedar Park, TX (US); Ruchir Puri, Baldwin Place, NY (US); Shyam Ramji, Lagrangeville, NY (US); Ashish K. Singh, Austin, TX (US); Chin Ngai Sze, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 843 days.

(21) Appl. No.: 12/022,849

(22) Filed: Jan. 30, 2008

(65) Prior Publication Data

US 2009/0193376 A1 Jul. 30, 2009

(51) Int. Cl.
*G06F 17/50* (2006.01)
(52) U.S. Cl. ...................................................... 716/120
(58) Field of Classification Search ............. 716/30–139
See application file for complete search history.

(56) References Cited

U.S. PATENT DOCUMENTS

| | | | |
|---|---|---|---|
| 6,266,803 B1 | 7/2001 | Sherer et al. | |
| 6,311,313 B1 | 10/2001 | Camporese et al. | |
| 6,609,228 B1 * | 8/2003 | Bergeron et al. | 716/113 |
| 6,732,343 B2 | 5/2004 | Frerichs et al. | |
| 6,941,533 B2 | 9/2005 | Andreev et al. | |
| 7,117,470 B1 | 10/2006 | Tieg et al. | |
| 7,225,421 B2 | 5/2007 | Migatz et al. | |
| 2002/0095647 A1 | 7/2002 | Bernstein et al. | |
| 2006/0031699 A1 | 2/2006 | Arthanari et al. | |
| 2007/0283350 A1 * | 12/2007 | Anderson et al. | 718/100 |

OTHER PUBLICATIONS

J. Max, "Quantizing for minimum distortion," *IEEE Trans. on Information Theory*, pp. 7-12, Mar. 1960.
R. Gray et al., "Quantization," *IEEE Trans. on Information Theory*, v. 44, n. 6, pp. 2325-2383 (1998).

\* cited by examiner

*Primary Examiner* — Vuthe Siek
*Assistant Examiner* — Aric Lin
(74) *Attorney, Agent, or Firm* — Preston J. Young; Jack V. Masgrove

(57) ABSTRACT

Power, routability and electromigration have become crucial issues in modern microprocessor designs. In high performance designs, clocks are the highest consumer of power. Arranging clocking components with regularity so as to minimize the capacitance on the clock nets can help reduce clock power, however, it may hurt performance due to some loss of flexibility in physically placing those components. The present invention provides techniques to optimally place clock components in a regular fashion so as to minimize clock power within a performance constraint. A rectangular grid is created and clock distribution structures are assigned to the grid intersection points. Latches are then located around the clock distribution structures to minimize an overall distance for connections between the latches and respective clock distribution structures. The horizontal and vertical pitches of the grid may be independently adjusted to achieve a more uniform spread of the clock distribution structures.

17 Claims, 7 Drawing Sheets

CLOCK POWER MINIMIZATION WITH REGULAR PHYSICAL PLACEMENT OF CLOCK REPEATER COMPONENTS

STATEMENT REGARDING FEDERALLY SPONSORED RESEARCH OR DEVELOPMENT

This invention was made with Government support under DARPA, HR0011-07-9-0002. THE GOVERNMENT HAS CERTAIN RIGHTS IN THIS INVENTION.

BACKGROUND OF THE INVENTION

1. Field of the Invention

The present invention generally relates to the fabrication and design of semiconductor chips and integrated circuits, and more particularly to a method of designing the physical layout (placement) of latches and other logic cells which receive clock signals from clock distribution structures such as local clock buffers.

2. Description of the Related Art

Integrated circuits are used for a wide variety of electronic applications, from simple devices such as wristwatches to the most complex computer systems. A microelectronic integrated circuit (IC) chip can generally be thought of as a collection of logic cells with electrical interconnections between the cells, formed on a semiconductor substrate (e.g., silicon). An IC may include a very large number of cells and require complicated connections between the cells. A cell is a group of one or more circuit elements such as transistors, capacitors, resistors, inductors, and other basic circuit elements grouped to perform a logic function. Cell types include, for example, core cells, scan cells and input/output (I/O) cells. Each of the cells of an IC may have one or more pins, each of which in turn may be connected to one or more other pins of the IC by wires. The wires connecting the pins of the IC are also formed on the surface of the chip. For more complex designs, there are typically at least four distinct layers of conducting media available for routing, such as a polysilicon layer and three metal layers (metal-1, metal-2, and metal-3). The polysilicon layer, metal-1, metal-2, and metal-3 are all used for vertical and/or horizontal routing.

An IC chip is fabricated by first conceiving the logical circuit description, and then converting that logical description into a physical description, or geometric layout. This process is usually carried out using a "netlist," which is a record of all of the nets, or interconnections, between the cell pins. A layout typically consists of a set of planar geometric shapes in several layers. The layout is then checked to ensure that it meets all of the design requirements, particularly timing requirements. The result is a set of design files known as an intermediate form that describes the layout. The design files are then converted into pattern generator files that are used to produce patterns called masks by an optical or electron beam pattern generator. During fabrication, these masks are used to pattern a silicon wafer using a sequence of photolithographic steps. The process of converting the specifications of an electrical circuit into a layout is called the physical design.

Cell placement in semiconductor fabrication involves a determination of where particular cells should optimally (or near-optimally) be located on the surface of an integrated circuit device. Due to the large number of components and the details required by the fabrication process for very large scale integrated (VLSI) devices, physical design is not practical without the aid of computers. As a result, most phases of physical design extensively use computer-aided design (CAD) tools, and many phases have already been partially or fully automated. Automation of the physical design process has increased the level of integration, reduced turn around time and enhanced chip performance. Several different programming languages have been created for electronic design automation (EDA) including Verilog, VHDL and TDML. A typical EDA system receives one or more high level behavioral descriptions of an IC device, and translates this high level design language description into netlists of various levels of abstraction.

While current placement techniques provide adequate placement of cells with regard to their data interconnections, there is an additional challenge for the designer in constructing a clock network for the cells and this challenge is becoming more difficult with the latest technologies like low-power, 65-nanometer integrated circuits. Low power circuits (e.g., around 20 watts or less for microprocessor chips) are becoming more prevalent due to power consumption problems. In particular, power dissipation has become a limiting factor for the yield of high-performance circuit designs (operating at frequencies around 1 gigahertz or more) with deep submicron technology. Clock nets can contribute up to 50% of the total active power in multi-GHz designs. Low power designs are also preferable since they exhibit less power supply noise and provide better tolerance with regard to manufacturing variations.

There are several techniques for minimizing power while still achieving timing objectives for high performance, low power systems. One method involves the use of local clock buffers (LCBs) to distribute the clock signals. A typical clock control system has a clock generation circuit (e.g., a phase-lock loop) that generates a master clock signal which is fed to a clock distribution network that renders synchronized global clock signals at the LCBs. Each LCB adjusts the global clock duty cycle and edges to meet the requirements of respective circuit elements, e.g., local logic circuits or latches. Since this clock network is one of the largest power consumers among all of the interconnects, it is further beneficial to control the capacitive load of the LCBs, each of which is driving a set of many clock sinks. One approach for reducing the capacitive load is latch clustering, i.e., clusters of latches placed near the respective LCB of their clock domain. Latch clustering combined with LCBs can significantly reduce the total clock wire capacitance which in turn reduces overall clock power consumption. Since most of the latches are placed close to an LCB, clock skew is also reduced which helps improve the timing of the circuit.

Conventional placement with LCBs and latch clustering is illustrated in the flow chart of FIG. 1. The process begins with an initial placement based on a layout for the circuit (1). The layout can be provided by an EDA tool, or can simply be a random layout for the circuit elements. The initial placement locates all circuit elements, including clock sinks, in a region of the integrated circuit using for example quadratic placement. Other placement techniques may be used but quadratic placement often produces better results than alternatives such as min-cut based placement. The quadratic placement portion of the process solves the linear system Ax=b where A is an optimization matrix, and x and b are vectors. During quadratic placement, cells are recursively partitioned into smaller bins until a target number of objects per bin is reached, such as five objects per bin. For the initial placement, all wires (edges) have the same net-weighting. The timing of the circuit is then analyzed and adjusted in early optimization (2). This optimization may include gate re-sizing and buffer insertion using a grid system such as a 50×50 grid in which buffers are assigned to grid cells having lower logic densities. A weighted placement (3) follows which is similar to step 1, but in the weighted placement the beginning layout is the output of the early optimization step 2 and different weights are applied to different edges based on the timing constraints. The partitioning may also be finer for the weighted placement, e.g., recursively partitioning until there are around two objects per bin. The weighted placement is then followed by late optimization which provides different logic optimizations such as buffer insertion but at a finer (or sometimes the same) level, e.g., in a 100×100 grid (4). Late optimization may be the same as early optimization, the conceptual difference being that early optimization works on a circuit which is never processed by layout-driven optimization steps.

Steps 1 and 3 of FIG. 1 do not differentiate between latches and other (non-clocked) logic cells, so at first the latches are allowed to move freely according to placement tools driven by data path timing. In the following steps the process focuses on the latches only, i.e., latches that are part of one or more clock domains. Latches are grouped into a given cluster based on locality and clock domain, and the LCB for a given clock domain is located at the centroid of the latch clusters and the latches are pulled to the LCB (5). For this latch-LCB driven placement, the size of the LCBs is temporarily shrunk to the same width as a latch. A relatively high weighting (attraction) is applied to the interconnections between the latch and the LCB for this placement step, e.g., by a factor of 10 compared to the net weights of the most critical data paths. In this manner all latches will be placed next to the corresponding LCB, which is then readjusted back to its original size. Further placement and optimization may be performed with the locations of the LCBs and latches fixed (6). The final step is detailed placement and optimization which refines the layout using for example min-cut placement or heuristic techniques (7).

The resulting LCB-latch structure can be very large relative to other circuit elements involved in the placement process, and greatly impacts the timing of the circuit. As the number of such LCB-latch clusters grows in more complex circuits, various problems arise including temperature distribution, clock latency, and inefficient use of LCBs with respect to drive capacity. It would, therefore, be desirable to devise an improved placement method which could optimally place clock components so as to reduce or minimize clock power within a performance constraint. It would be further advantageous if the method could retain flexibility in physical placement of the clock components to reduce clock skew.

SUMMARY OF THE INVENTION

It is therefore one object of the present invention to provide a placement method which improves clock power while reducing clock skew.

It is another object of the present invention to provide such a method which results in better temperature distribution within an integrated circuit.

It is yet another object of the present invention to provide such a method which reduces clock latency from a global clock grid to local clock buffers to improve clock cycle time.

The foregoing objects are achieved in a method for designing the layout of a plurality of latches in one or more clock domains of an integrated circuit by receiving an input layout of the latches, creating a rectangular grid in a region of the integrated circuit containing the latches, the grid having grid intersection points defined by a horizontal pitch and a vertical pitch, assigning clock distribution structures to the grid intersection points, and locating the latches around the clock distribution structures to minimize an overall distance for connections between the latches and respective clock distribution structures. The assignment of clock distribution structures may include bipartite matching of the clock distribution structures to the grid intersection points for all corresponding clock domains, while the latch location may also include bipartite matching of latches to corresponding clock distribution structures. The horizontal and vertical pitches may be independently adjusted to achieve a more uniform spread of the clock distribution structures. The grid preferably has a perimeter defined by a bounding box of the circuit layout. The grid may have the same or different horizontal pitch and vertical pitch. If the pitches are the same, they may be calculated based on rectangular dimensions of the grid and a predetermined number of LCBs to be utilized.

The above as well as additional objectives, features, and advantages of the present invention will become apparent in the following detailed written description.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
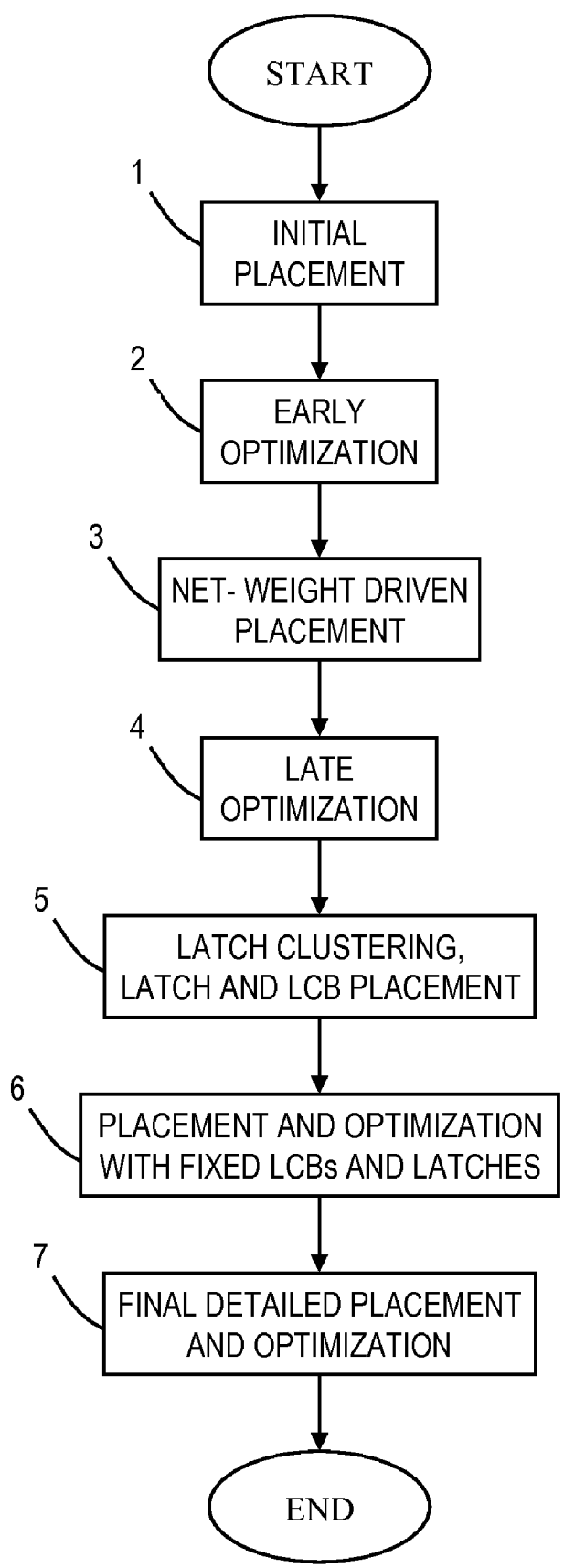
FIG. 1 is a chart illustrating the logical flow for a conventional latch placement technique with clock optimization followed by latch-LCB driven placement.
Figure 2:
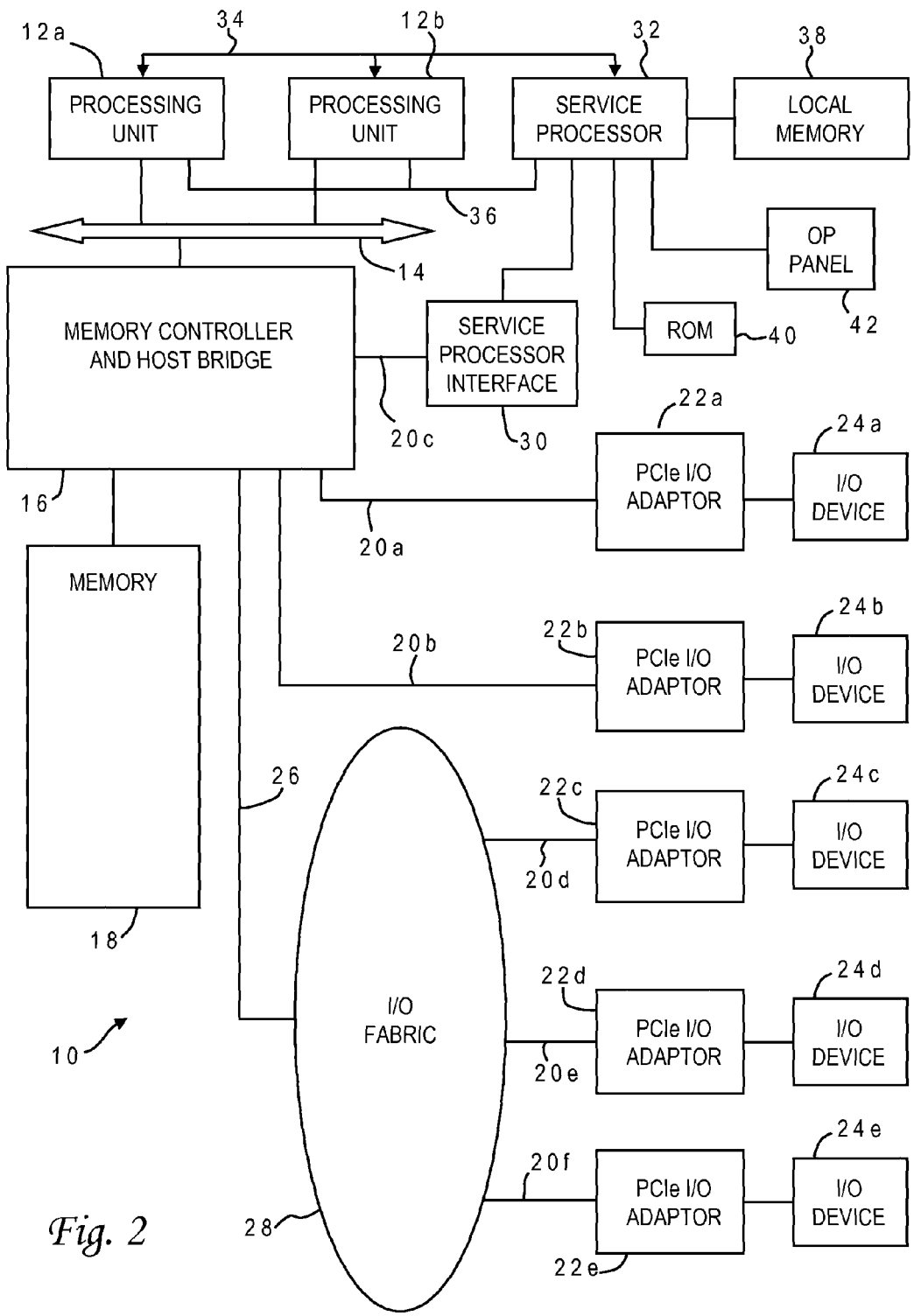
FIG. 2 is a block diagram of a computer system programmed to carry out computer-aided design of an integrated circuit in accordance with one implementation of the present invention.

With reference now to the figures, and in particular with reference to FIG. 2, there is depicted one embodiment 10 of a computer system in which the present invention may be implemented. Computer system 10 is a symmetric multiprocessor (SMP) system having a plurality of processors 12a, 12b connected to a system bus 14. System bus 14 is further connected to a combined memory controller/host bridge (MC/HB) 16 which provides an interface to system memory 18. System memory 18 may be a local memory device or alternatively may include a plurality of distributed memory devices, preferably dynamic random-access memory (DRAM). There may be additional structures in the memory hierarchy which are not depicted, such as on-board (L1) and second-level (L2) or third-level (L3) caches.

MC/HB 16 also has an interface to peripheral component interconnect (PCI) Express links 20a, 20b, 20c. Each PCI Express (PCIe) link 20a, 20b is connected to a respective PCIe adaptor 22a, 22b, and each PCIe adaptor 22a, 22b is connected to a respective input/output (I/O) device 24a, 24b. MC/HB 16 may additionally have an interface to an I/O bus 26 which is connected to a switch (I/O fabric) 28. Switch 28 provides a fan-out for the I/O bus to a plurality of PCI links 20d, 20e, 20f. These PCI links are connected to more PCIe adaptors 22c, 22d, 22e which in turn support more I/O devices 24c, 24d, 24e. The I/O devices may include, without limitation, a keyboard, a graphical pointing device (mouse), a microphone, a display device, speakers, a permanent storage device (hard disk drive) or an array of such storage devices, an optical disk drive, and a network card. Each PCIe adaptor provides an interface between the PCI link and the respective I/O device. MC/HB 16 provides a low latency path through which processors 12a, 12b may access PCI devices mapped anywhere within bus memory or I/O address spaces. MC/HB 16 further provides a high bandwidth path to allow the PCI devices to access memory 18. Switch 28 may provide peer-to-peer communications between different endpoints and this data traffic does not need to be forwarded to MC/HB 16 if it does not involve cache-coherent memory transfers. Switch 28 is shown as a separate logical component but it could be integrated into MC/HB 16.

In this embodiment, PCI link 20c connects MC/HB 16 to a service processor interface 30 to allow communications between I/O device 24a and a service processor 32. Service processor 32 is connected to processors 12a, 12b via a JTAG interface 34, and uses an attention line 36 which interrupts the operation of processors 12a, 12b. Service processor 32 may have its own local memory 38, and is connected to read-only memory (ROM) 40 which stores various program instructions for system startup. Service processor 32 may also have access to a hardware operator panel 42 to provide system status and diagnostic information.

In alternative embodiments computer system 10 may include modifications of these hardware components or their interconnections, or additional components, so the depicted example should not be construed as implying any architectural limitations with respect to the present invention.

When computer system 10 is initially powered up, service processor 32 uses JTAG interface 34 to interrogate the system (host) processors 12a, 12b and MC/HB 16. After completing the interrogation, service processor 32 acquires an inventory and topology for computer system 10. Service processor 32 then executes various tests such as built-in-self-tests (BISTs), basic assurance tests (BATs), and memory tests on the components of computer system 10. Any error information for failures detected during the testing is reported by service processor 32 to operator panel 42. If a valid configuration of system resources is still possible after taking out any components found to be faulty during the testing then computer system 10 is allowed to proceed. Executable code is loaded into memory 18 and service processor 32 releases host processors 12a, 12b for execution of the program code, e.g., an operating system (OS) which is used to launch applications and in particular the circuit design application of the present invention, results of which may be stored in a hard disk drive (I/O device 24).

While the illustrative implementation provides program instructions embodying the present invention on the hard disk, those skilled in the art will appreciate that the invention can be embodied in a program product utilizing other computer-readable media. The program instructions may be written using the C++ programming language for an AIX environment. Computer system 10 carries out program instructions for placement of clock sinks in the design of an integrated circuit using a novel technique wherein the sinks are preferably initially placed and optimized by conventional methods and thereafter are optimized for clock power as explained further below. Accordingly, a program embodying the invention may include conventional aspects of various quadratic optimizers, cut-based partitioners, buffer insertion tools, etc. and these details will become apparent to those skilled in the art upon reference to this disclosure. Although these clock sinks are referred to herein as latches, these terms includes devices such as flip-flops, dynamic logic circuits, or any combination of these and other clocked circuit elements. The integrated circuit designed in accordance with the present invention may for example be a random logic module (macro).

Figure 3:
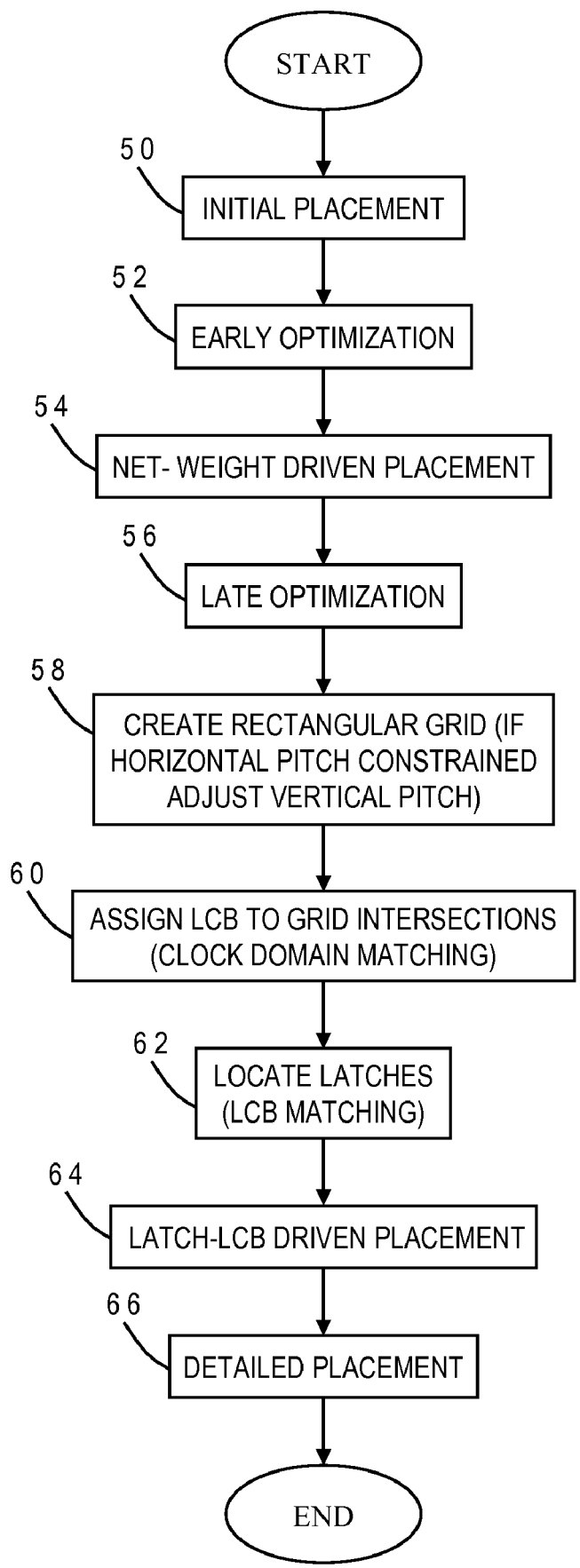
FIG. 3 is a chart illustrating the logical flow for regular physical placement of clock repeater components according to one implementation of the present invention.

The present invention may be further understood with reference to the chart of FIG. 3 which illustrates the logical flow according to one implementation of the present invention. The invention begins when computer system 10 receives input data in the form of a netlist or other circuit description with a source and multiple sinks for each clock domain, as well as the clock domain information (prior to initial placement the design may be clock traced to assign latches to their respective domain groups). In this regard, the term "clock domain" generally refers to any non-data signal that is used to gate one or more sinks. The input data may also include gating source information for the domain group. A starting layout of the sinks can be provided by an EDA tool, or can simply be a random layout for the circuit elements.

The automated method starts with an initial quadratic placement of the sinks (latches) together with other logic cells of the circuit, in which they are recursively partitioned into smaller bins until a threshold number of objects per bin e.g., five, is reached (50). For the initial placement, all wires (edges) have equal weighting. The timing of the circuit is then analyzed and adjusted in early optimization, including gate re-sizing and buffer insertion using, e.g., a 10×10 grid in which buffers are assigned to grid cells having lower logic densities (52). A net-weight driven placement follows which is similar to the initial placement, but in the net-weight driven placement different weights are applied to different edges according to their criticality in meeting timing constraints, and the circuit elements are recursively partitioned until there are a smaller number of objects per bin, e.g., two (54). Late optimization performs gate resizing and buffer insertion with, e.g., a 100×100 grid (56).

The results of late optimization provide an input layout of the latches for further clock network optimization using clock distribution structures such as splitters or local clock buffers (LCBs). The clock network construction begins by creating a rectangular grid within the available region of the integrated circuit (58). The grid may have the same horizontal and vertical pitch, or if only one pitch is constrained the other pitch may be adjusted. Alternatively both pitches may be constrained by the designer. Details of the grid creation are discussed further below in conjunction with FIG. 4. Once the grid is established, LCBs are assigned to the grid intersection points (60). In the physical design the LCBs are placed directly under (or over) clock pins of the integrated circuit at these grid intersection points. Arranging these clocking components with some regularity lowers the capacitance of the clock network and thereby reduces clock power. The latches are then located with regard to the placed LCBs (62). LCB-to-clock assignment and latch location may be performed using the bipartite matching algorithm discussed further below in conjunction with FIG. 5.

Latch-LCB driven placement follows wherein the size of the LCBs is temporarily shrunk to the same width as a latch and a relatively high weighting (attraction) is applied to the interconnections between the latch and the LCB for this placement step, e.g., by a factor of 10 compared to the net weights of the most critical data paths (64). All latches are placed next to their corresponding LCB, which is then readjusted back to its original size. The final step is detailed placement which refines the layout using for example min-cut placement or heuristic techniques with a placer such as TIMBERWOLF (66).

Figure 4:
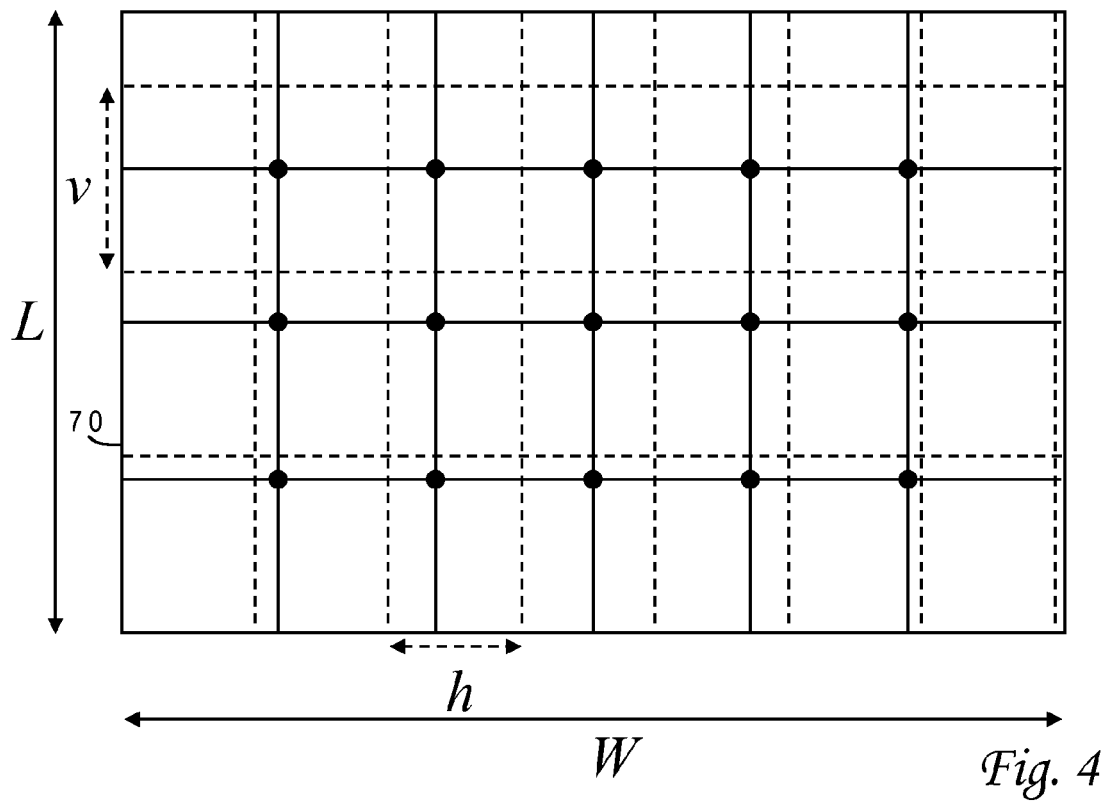
FIG. 4 is a plan view of a region of an integrated circuit which is divided into a grid in accordance with the present invention wherein the clock repeater components are located at intersection points of the grid.

Referring now to FIG. 4, a rectangular grid 70 is shown which is used to locate the LCBs. It is preferable to restrict the region in which to place the LCBs (i.e., the grid area) to a bounding box which surrounds all of the latches in order to avoid a skewed distribution. Grid 70 has a vertical pitch v and a horizontal pitch h which define grid intersection points. If there are no constraints on the pitches, the regularity of the grid is maximized by providing equal horizontal and vertical pitches, i.e., v=h, which is indicated by the solid interior lines of grid 70. The value of the pitches is then calculated by the dimensions of the available region of the integrated circuit and a predetermined number of LCBs to be utilized. Specifically, it can be shown that the pitch h=[$h_\alpha$], i.e., the smallest integer less than or equal to $h_\alpha$ according to the formula $$h_\alpha = \frac{-(W+L) + \sqrt{(W+L)^2 + 4WL(l-1)}}{2(l-1)}.$$

where W is the width (horizontal dimension) of the region, L is the length (vertical dimension) of the region, and l is the number of LCBs to be utilized. After net-weight driven placement (54) the designer knows how many LCBs are necessary based on parameters such as the LCB drive strength (fan-out constraint) and capacitive loading. The number of LCBs in a given row is then equal to (W/h−1) and the number of LCBs in a given column is equal to (L/h−1).

Either or both of the horizontal and vertical pitches may be specified. If only one pitch is constrained then the other may be adjusted for further optimality, e.g., if h is constrained then v is adjusted. The horizontal pitch may be selected based on clock pre-wires. An exemplary value is 29.1μ. The vertical pitch is then chosen so as to make the LCBs as far apart as possible.

Figure 5:
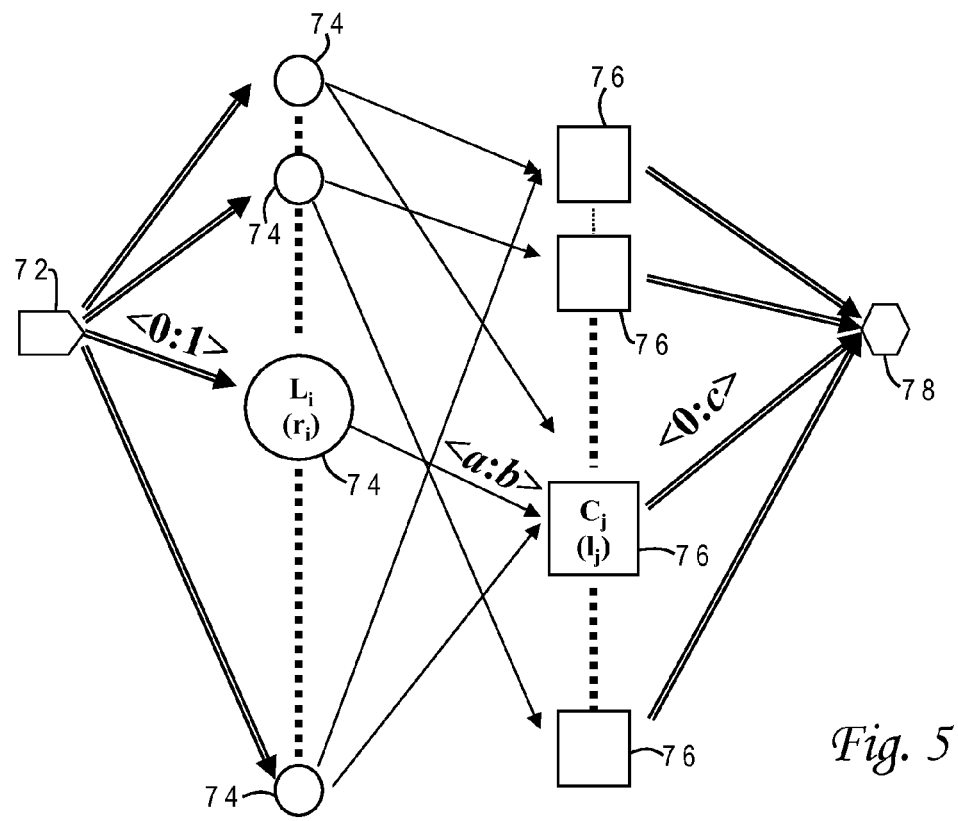
FIG. 5 is a graphical representation of a bipartite solution which may be uses for LCB-to-clock assignment and latch-to-LCB assignment.

With further reference to FIG. 5, the assignment of LCBs to grid intersection points is preferably carried out using clock domain matching. A grid may have more intersections than LCBs, and LCBs may also belong to different clock domain, so the situation should be avoided wherein a particular LCB in one clock domain is assigned to a location (intersection point) such that all or most of the latches in that clock domain are very far away from that location. In order to make LCB assignment latch location aware, it can be modeled as a minimum-cost, maximum-flow problem solved by bipartite matching. A source 72 fans out to multiple potential LCB locations 74 in the grid. Each LCB ($L_i$) can be part of only one clock domain 76, and the clock domains 76 have a sink 78. Each link of these logical relationships has an associated cost and capacity. For the source-to-grid intersection links the cost and capacity are shown as <0:1>. For the grid intersection-to-clock links the cost and capacity are shown as <a:1> where a is the minimum distance d($L_i$, $C_j$) from grid intersection point $L_i$ to clock domain $C_j$ such that there exits a minimum number of registers (e.g., 20) in that clock domain within that distance. For the clock-sink links the cost and capacity are <0:b> where b is the number of LCBs needed in clock domain $C_j$. Grid intersection points are matched to clock domains by minimizing the total cost while maintaining maximum flow (capacity). Finding the maximum-flow, minimum-cost solution to the graph ensures that each grid intersection point ($L_i$) will be used at most once, because the flow on the source-to-grid intersection is at most one. Since the clock domain-to-sink flow is at most $b_j$, each clock domain $C_j$ is assigned $b_j$ grid intersection points for LCB placement for the maximum-flow solution. Since the solution is minimum-cost, this clock domain matching eliminates excessively long connections.

The latch-LCB connections may be similarly solved using bipartite matching, but in this case the circles 74 of FIG. 5 represent latches $r_1, r_2, \ldots, r_n$ and the squares 76 represent LCBs $l_1, l_2, \ldots, l_m$. The cost and capacity for each source-latch link are still <0:1>. The cost and capacity of the interior link (latch-LCB) is <a:1> where a is now the distance between the $i^{th}$ latch and the $j^{th}$ LCB, denoted by d($r_i, l_j$). This distance is set to infinity for any connection that has longer than a threshold distance (the minimum distance which if exceeded would lead to a clock violation). This distance is also set to infinity for any latch-LCB pair which belongs to different clock domains. The cost and capacity for the LCB-sink links are <0:b> where b is now the maximum number of latches that an LCB can drive. The latch-LCB matching minimizes the sum of the distances over all of the latch-LCB connections, i.e., minimizes (under the constraint that flow is maximum) the sum:

$$\sum_{i=1}^{n} \sum_{j=1}^{m} d(r_i, l_j) x(i, j)$$

where x(i,j) is one if there is a connection between $r_i$ and $l_j$, otherwise it is zero. Manhattan distance or Euclidean distance may be used as the objective to be minimized.

Figure 6B:
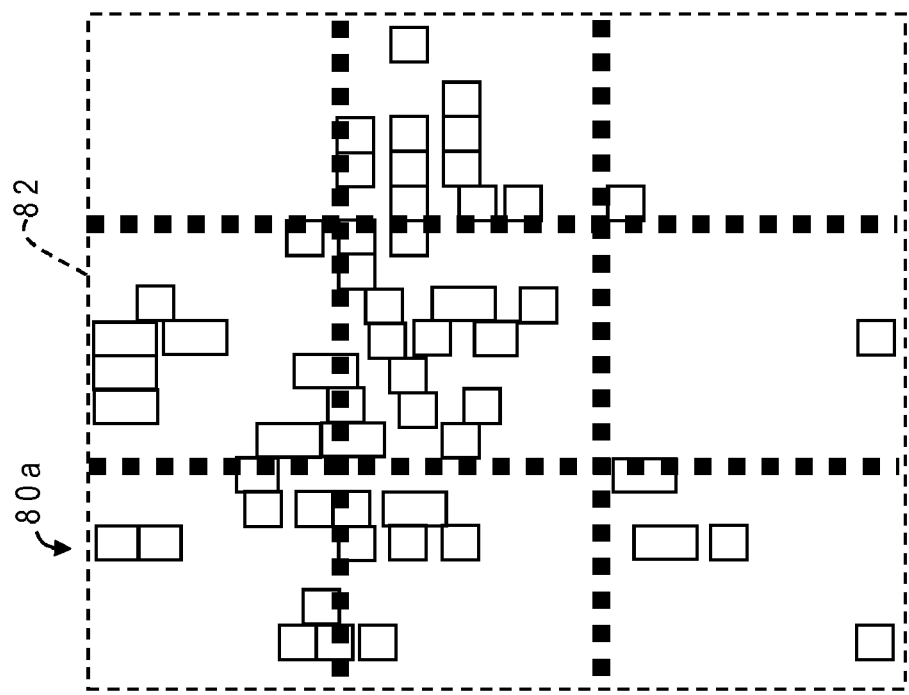
FIGS. 6A-6E are plan views for layouts of an integrated circuit which start with an input layout of latches in one or more clock domains, and subsequent placement of local clock buffers in accordance with one implementation of the present invention.
Figure 6A:
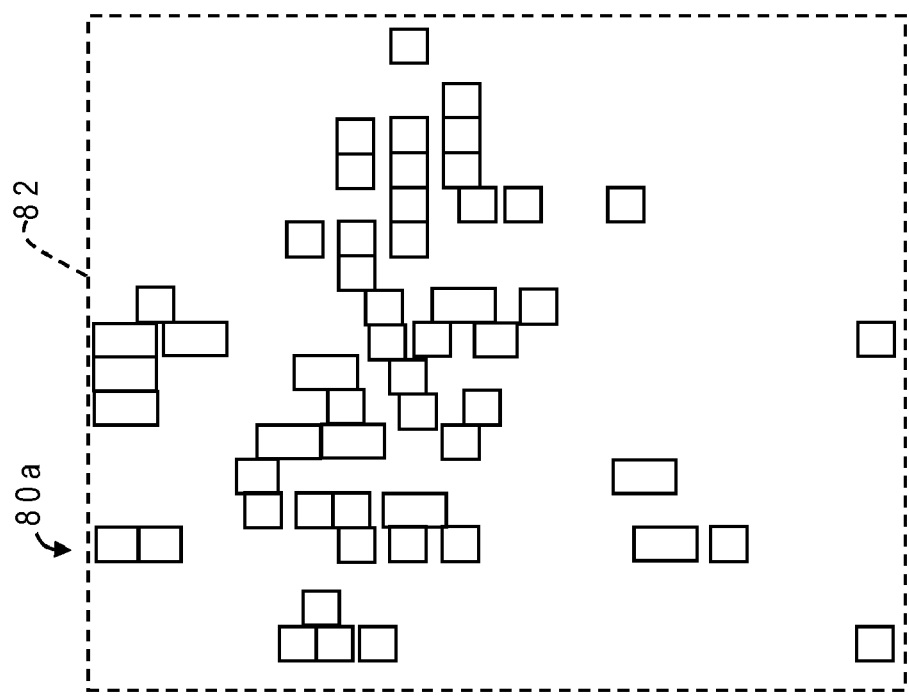
Figure 6D:
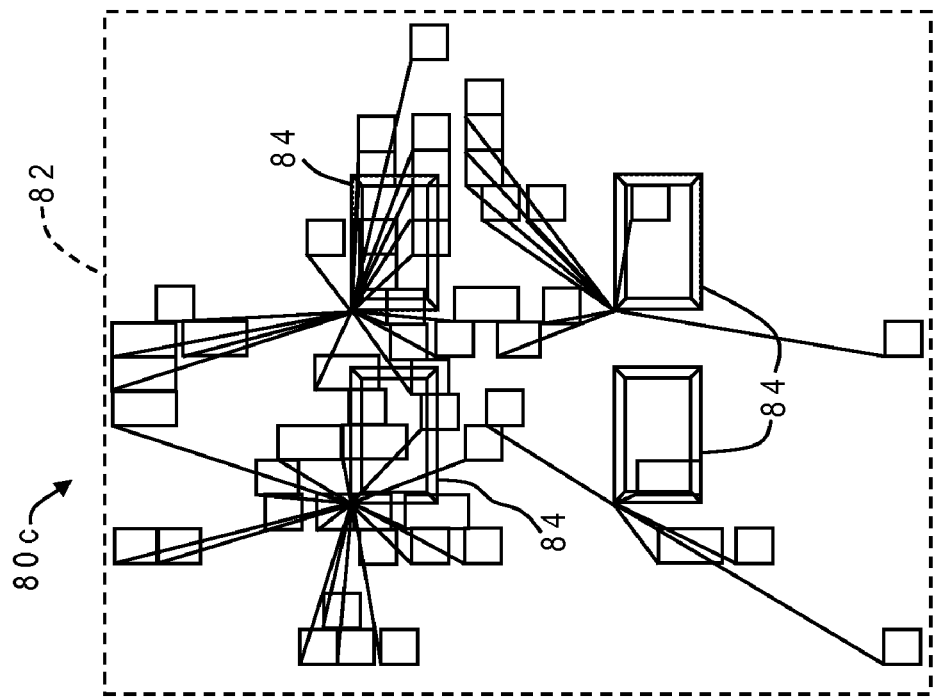
Figure 6C:
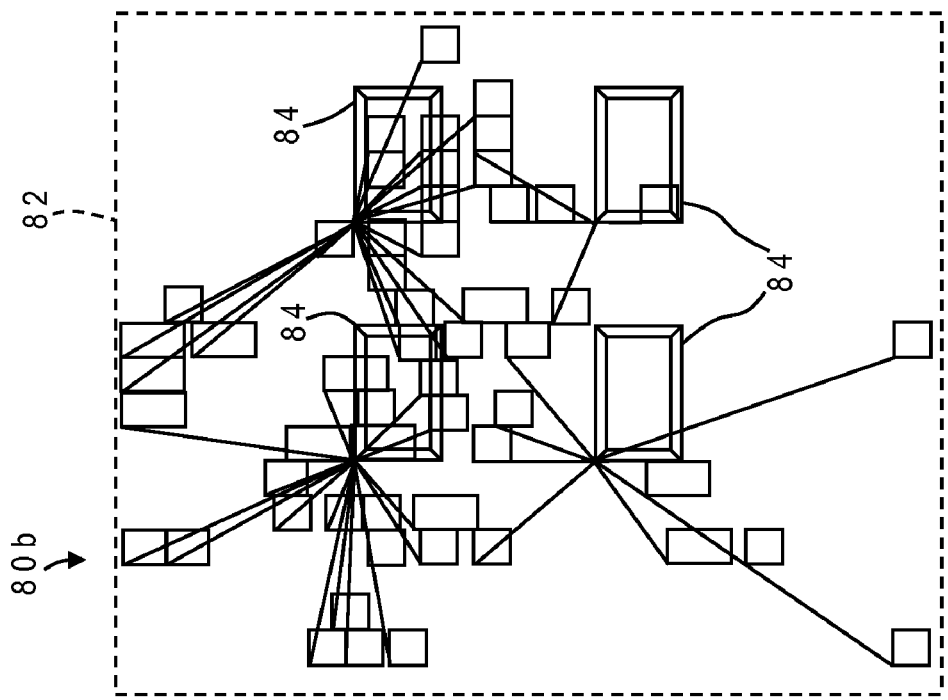
Figure 6E:
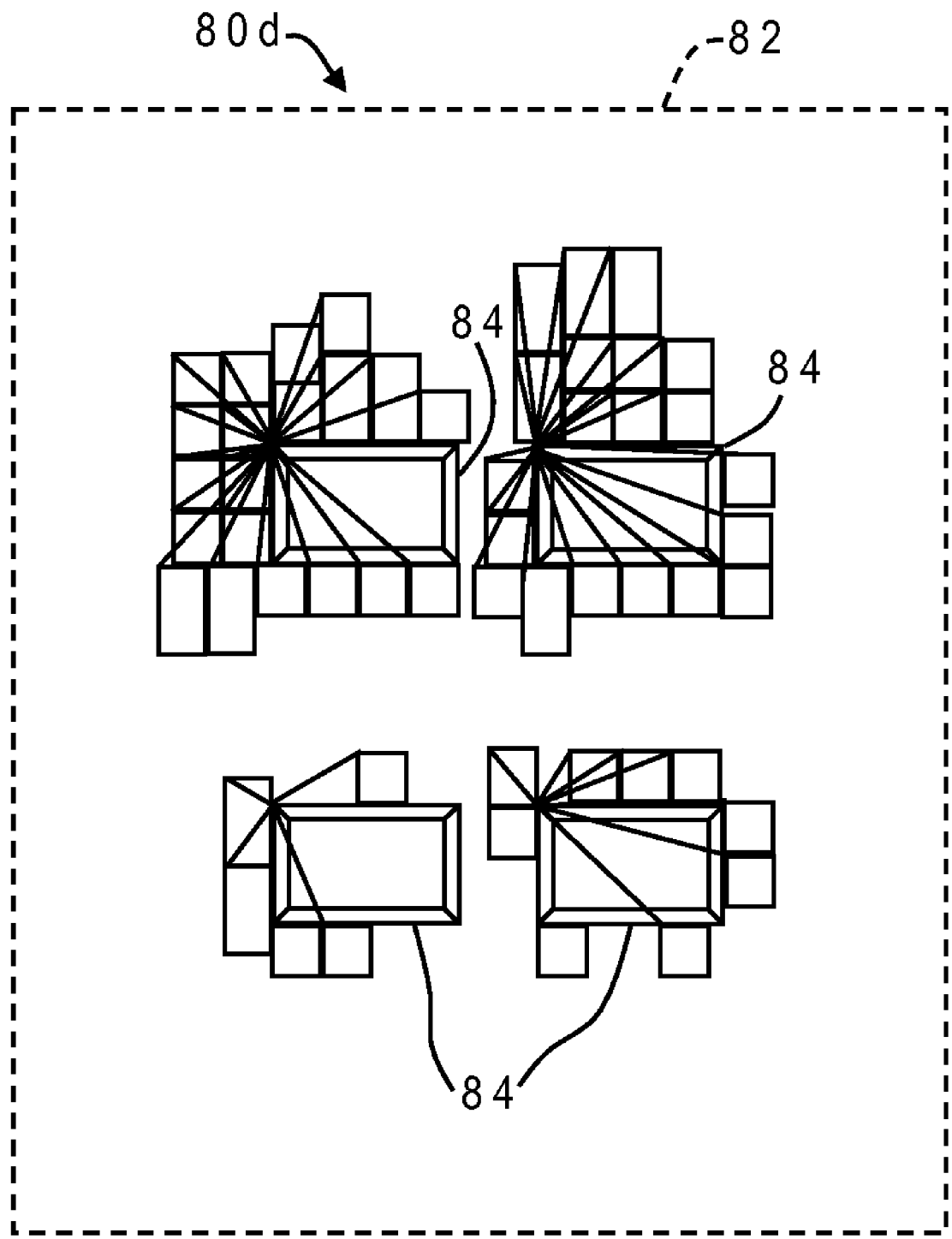

FIGS. 6A-6E illustrate different stages of a design in the placement process of the present invention. FIG. 6A shows only the latches for an input layout 80a of an integrated circuit that may be derived using EDA tools as discussed above, prior to generation of the clock network. Input layout 80a includes a plurality of latches which can be used to define a bounding box 82. FIG. 6B shows a grid with equal vertical and horizontal pitch applied to layout 80a, which has been used in FIG. 6C to locate LCBs 84 in a layout 80b wherein the latches are in the same locations, and the LCBs are matched to the latches using the bipartite solution. FIG. 6D illustrates how the vertical and horizontal pitch may be independently adjusted or tuned to achieve more uniform spread for a layout 80c. This pitch adjustment changes some latch-to-LCB assignments. In FIG. 6E a final layout 80d has shifted the latches closer to LCBs 84 using latch-LCB driven placement to further minimize overall latch-to-LCB connection distance.

In the resulting circuit macro design, since each clock buffer is placed underneath a macro clock input pin and the latches driven by this clock buffer are placed closely surrounding it, there is near-zero wire capacitance between clock buffers and macro clock pins, and clock signals arrive at each latch at nearly the same time. The regular placement of clock buffers on pins thus improves clock power while reducing clock skew, reducing clock latency, and controlling the electro-migration effect, and the ability to adjust the grid intersection points for placing the buffers imparts further flexibility to the optimization process. This optimization also includes consideration of the preferred sink locations and does require that they be moved long distances. The present invention thereby provides more design predictability and greater utilization of the maximum LCB latch drive strength.

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. In the simplified example of FIG. 6, there are 54 latches and four LCBs in a single clock domain but those skilled in the art will appreciate that practical applications of the invention may involve hundreds or thousands of clock sinks with larger numbers of latch-LCB clusters and additional clock domains. It is therefore contemplated that such modifications can be made without departing from the spirit or scope of the present invention as defined in the appended claims.

What is claimed is:

1. A method for designing the layout of a plurality of latches in two or more clock domains of an integrated circuit carried out by a computer system, comprising:
   receiving an input layout of logic cells which include the latches located in a common plane, by executing first program instructions in the computer system;
   creating a rectangular grid in a region of the integrated circuit containing the latches, the grid having grid intersection points defined by a horizontal pitch and a vertical pitch, by executing second program instructions in the computer system;
   placing clock distribution structures at the grid intersection points in the common plane of the latches, said placing including bipartite matching of (i) cost and capacity for clock distribution structures to (ii) corresponding clock domains, by executing third program instructions in the computer system; and
   locating the latches around the clock distribution structures to minimize an overall distance for connections between the latches and respective clock distribution structures, by executing fourth program instructions in the computer system.

2. The method of claim 1 wherein said locating includes bipartite matching of (i) cost and capacity for latches to (ii) corresponding clock distribution structures.

3. The method of claim 1 wherein at least one of the horizontal and vertical pitches is independently adjusted to achieve a more uniform spread of the clock distribution structures.

4. The method of claim 1 wherein the grid has a perimeter defined by a bounding box surrounding the latches.

5. The method of claim 1 wherein the grid has the same horizontal pitch and vertical pitch.

6. The method of claim 5 wherein the pitches are an integer less than or equal to $h_\alpha$ according to the formula $$h_\alpha = \frac{-(W+L) = \sqrt{(W+L)^2 + 4WL(l-1)}}{2(l-1)}$$

where W is the width of the grid, L is the length of the grid, and l is a predetermined number of clock distribution structures to be utilized.

7. A computer system comprising:
   one or more processors which process program instructions;
   a memory device connected to said one or more processors; and
   program instructions residing in said memory device for designing the layout of a plurality of latches in two or more clock domains of an integrated circuit by receiving an input layout of logic cells which include the latches located in a common plane, creating a rectangular grid in a region of the integrated circuit containing the latches wherein the grid has grid intersection points defined by a horizontal pitch and a vertical pitch, placing clock distribution structures at the grid intersection points in the common plane of the latches, said placing including bipartite matching of (i) cost and capacity for clock distribution structures to (ii) corresponding clock domains, and locating the latches around the clock distribution structures to minimize an overall distance for connections between the latches and respective clock distribution structures.

8. The computer system of claim 7 wherein said locating includes bipartite matching of (i) cost and capacity for latches to (ii) corresponding clock distribution structures.

9. The computer system of claim 7 wherein at least one of the horizontal and vertical pitches is independently adjusted to achieve a more uniform spread of the clock distribution structures.

10. The computer system of claim 7 wherein the grid has a perimeter defined by a bounding box surrounding the latches.

11. The computer system of claim 7 wherein the grid has the same horizontal pitch and vertical pitch.

12. A computer program product comprising:
    a computer-readable storage medium; and
    program instructions residing in said storage medium for designing the layout of a plurality of latches in two or more clock domains of an integrated circuit by receiving an input layout of logic cells which include the latches located in a common plane, creating a rectangular grid in a region of the integrated circuit containing the latches wherein the grid has grid intersection points defined by a horizontal pitch and a vertical pitch, placing clock distribution structures at the grid intersection points in the common plane of the latches, said placing including bipartite matching of (i) cost and capacity for clock distribution structures to (ii) corresponding clock domains, and locating the latches around the clock distribution structures to minimize an overall distance for connections between the latches and respective clock distribution structures.

13. The computer program product of claim 12 wherein said locating includes bipartite matching of (i) cost and capacity for latches to (ii) corresponding clock distribution structures.

14. The computer program product of claim 12 wherein at least one of the horizontal and vertical pitches is independently adjusted to achieve a more uniform spread of the clock distribution structures.

15. The computer program product of claim 12 wherein the grid has a perimeter defined by a bounding box surrounding the latches.

16. The computer program product of claim 12 wherein the grid has the same horizontal pitch and vertical pitch.

17. The computer program product of claim 16 wherein the pitches are an integer less than or equal to $h_\alpha$ according to the formula $$h_\alpha = \frac{-(W+L) = \sqrt{(W+L)^2 + 4WL(l-1)}}{2(l-1)}$$

where W is the width of the grid, L is the length of the grid, and l is a predetermined number of clock distribution structures to be utilized.

* * * * *